(12) United States Patent
Sutardja et al.

(10) Patent No.: US 8,030,128 B1
(45) Date of Patent: Oct. 4, 2011

(54) METHOD TO FORM HIGH DENSITY PHASE CHANGE MEMORY (PCM) TOP CONTACT EVERY TWO BITS

(75) Inventors: Pantas Sutardja, Los Gatos, CA (US); Albert Wu, Palo Alto, CA (US); Runzi Chang, Santa Clara, CA (US); Chien-Chuan Wei, Sunnyvale, CA (US); Winston Lee, Palo Alto, CA (US); Peter Lee, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 576 days.

(21) Appl. No.: 12/104,215

(22) Filed: Apr. 16, 2008

Related U.S. Application Data (60) Provisional application No. 60/913,342, filed on Apr. 23, 2007, provisional application No. 60/944,663, filed on Jun. 18, 2007.

(51) Int. Cl.
*H01L 21/06* (2006.01)

(52) U.S. Cl. ....... 438/102; 438/95; 257/3; 257/E47.001; 257/E47.005; 257/E21.068

(58) Field of Classification Search .................. 438/102, 438/95; 257/3, E21.068, E47.001, E47.005, 257/E45.002, E45.003
See application file for complete search history.

(56) References Cited

U.S. PATENT DOCUMENTS

| | | | |
|---|---|---|---|
| 7,709,835 B2 * | 5/2010 | Sutardja et al. | 257/42 |
| 7,745,809 B1 * | 6/2010 | Sutardja et al. | 257/3 |
| 2002/0079483 A1 * | 6/2002 | Dennison | 257/5 |
| 2003/0003709 A1 * | 1/2003 | Xu | 438/624 |
| 2006/0091492 A1 * | 5/2006 | Lee et al. | 257/467 |
| 2006/0105556 A1 * | 5/2006 | Matsui et al. | 438/584 |
| 2007/0020797 A1 * | 1/2007 | Pellizzer et al. | 438/95 |
| 2008/0185570 A1 * | 8/2008 | Wu et al. | 257/3 |

* cited by examiner

*Primary Examiner* — Angel Roman (57) ABSTRACT

Embodiments of the present invention provide a method that includes providing a substrate including an emitter layer comprising a plurality of emitters, each emitter defining an axis, forming a heater layer above the emitter layer, and forming a phase change memory (PCM) cell layer above the heater layer. The method also includes forming a top contact layer above the PCM cell layer. The top contact layer comprises a plurality of top contacts, where each top contact is located between two axes. Other embodiments are also described.

22 Claims, 8 Drawing Sheets

METHOD TO FORM HIGH DENSITY PHASE CHANGE MEMORY (PCM) TOP CONTACT EVERY TWO BITS

CROSS REFERENCE TO RELATED APPLICATIONS

The present application claims priority to U.S. Patent Application No. 60/913,342, filed Apr. 23, 2007, entitled "High Density PCM Top Contact Every Two Bits," and U.S. Patent Application No. 60/944,663, filed Jun. 18, 2007, entitled "Rectangular Contacts," the entire specifications of which are hereby incorporated by reference in their entirety for all purposes, except for those sections, if any, that are inconsistent with this specification.

TECHNICAL FIELD

Embodiments of the present invention relate to the field of electronic memory devices, and more particularly, to phase change material (PCM) memory devices and methods for fabricating thereof.

BACKGROUND

Memory cells of electronic memory devices such as dynamic random access memory typically employ a number of electronic components in order to save data. For instance, in order to store data, a combination of electronic components such as transistors, diodes, and/or capacitors are typically employed in such memory cells to store or not store electrical charges. If a charge is stored in such a memory cell, that may indicate a logic "1," and if no charge is stored in such a memory cell that may indicate a logic "0."

An alternative approach for storing data is to use memory cells made of phase change material (PCM). A PCM is a material that can be placed into at least two physical states, a crystalline state and an amorphous state, by increasing or decreasing temperature. By changing the physical state of the PCM, certain characteristics of the material, such as electrical resistance, may also change. Such properties may be exploited in order to form memory cells made of PCM (herein "PCM cells").

Such memory cells are generally intricate and expensive to manufacture. Thus, it is important to manufacture them in such a way to ensure accuracy and reliability such that few memory cells are wasted. One concern involves the contact between a heater element and the PCM. Since it is undesirable to heat up the PCM, it is desirable to have a small contact between the PCM and the heater element. It is also desirable to have a high aspect ratio of a top contact on the PCM and to manufacture the cells in such a way that ensures quality but that is also efficient and economical.

SUMMARY

In accordance with various embodiments of the present invention, a method includes providing a substrate including an emitter layer comprising a plurality of emitters, each emitter defining an axis, forming a heater layer above the emitter layer, forming a phase change memory (PCM) cell layer above the heater layer, and forming a top contact layer above the PCM cell layer, the top contact layer comprising a plurality of top contacts, each top contact being located between two axes.

In accordance with various embodiments, each top contact has a substantially rectangular shape.

In accordance with various embodiments, each top contact comprises tungsten.

In accordance with various embodiments, forming a heater layer comprises forming heater trenches above the emitter layer, each heater trench having a width that extends across at least respective portions of two emitters, and depositing a heater alloy layer within the heater trenches and depositing a first nitride layer over the heater alloy layer. The step further comprises performing an anisotropic etching of the first nitride layer and the heater alloy layer, and depositing an oxide layer over the first nitride layer. In accordance with various embodiments, the step further comprises performing a lithographic operation on the substrate at the heater layer to form two heater elements within each heater trench.

In accordance with various embodiments, forming a PCM cell layer comprises depositing a second nitride layer over the heater elements and etching PCM trenches within the second nitride layer, depositing germanium antimony tellurium (GST) material within the PCM trenches, and performing an anisotropic etching of the GST material.

In accordance with various embodiments, the PCM trenches have a width that extends across at least a portion of one emitter. In accordance with various other embodiments, the PCM trenches have a width that extends across at least respective portions of two emitters.

In accordance with various embodiments, forming a top contact layer comprises performing a metallization such that each top contact comprises a metal alloy. In accordance with various embodiments, the metallization is performed with tungsten.

In accordance with various embodiments, the heater alloy layer comprises one of TiN or TaN.

In accordance with various embodiments, the plurality of emitters are arranged in rows and the top contacts are staggered with respect to top contacts in adjacent rows.

The present invention also provides an apparatus comprising a substrate including an emitter layer comprising a plurality of emitters, each emitter defining an axis, a heater layer above the emitter layer, a PCM cell layer above the heater layer, and a top contact layer above the PCM cell layer, the top contact layer comprising a plurality of top contacts, each top contact being located between two axes.

In accordance with various embodiments, each top contact has a substantially rectangular shape.

In accordance with various embodiments, each top contact comprises tungsten.

In accordance with various embodiments, the heater layer comprises heater elements within a heater trench, each heater element being adjacent an emitter, and each heater element having a substantially L-shape.

In accordance with various embodiments, each heater element comprises one of TiN or TaN.

In accordance with various embodiments, the PCM cell layer comprises PCM memory cells, each PCM memory cell being adjacent a vertical portion of a heater element.

In accordance with various embodiments, each top contact comprises tungsten.

In accordance with various embodiments, the PCM memory cell comprises GST.

In accordance with various embodiments, each top contact has a substantially rectangular shape.

In accordance with various embodiments, the plurality of emitters are arranged in rows and the top contacts are staggered with respect to top contacts in adjacent rows.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use perspective-based descriptions such as up/down, back/front, and top/bottom. Such descriptions are merely used to facilitate the discussion and are not intended to restrict the application of embodiments of the present invention.

For the purposes of the present invention, the phrase "A/B" means A or B. For the purposes of the present invention, the phrase "A and/or B" means "(A), (B), or (A and B)". For the purposes of the present invention, the phrase "at least one of A, B, and C" means "(A), (B), (C), (A and B), (A and C), (B and C), or (A, B and C)". For the purposes of the present invention, the phrase "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Embodiments of the present invention provide an ultra high density (UHD) phase change memory (PCM) apparatus and methods for fabricating the same.

Figure 1:
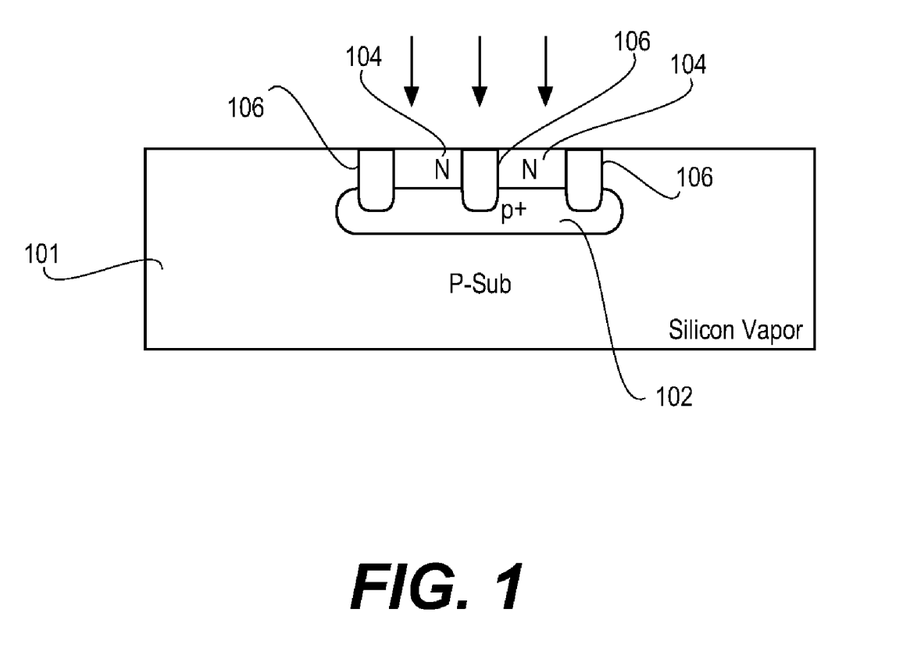
FIGS. 1-2 are cross sectional schematic views of a substrate after various operations, in accordance with various embodiments of the present invention.

Referring to FIG. 1, a memory cell area that will include two cells 100 as an example may be formed beginning with a memory cell area lithograph operation (Clear Tone Mask) that is performed on a silicon vapor substrate 101. A collector doping operation is performed to create a P+ collector region 102, followed by a base doping operation to create an N base region 104. Next, a shallow trench isolation (STI) lithographic operation is performed including etching and filling trenches 106 with oxide. This generally completes the memory cell area and thus, a chemical mechanical planarization (CMP) operation may be performed to smooth the various areas of the substrate 101. Those skilled in the art will understand that there are generally many more cells 100 that two.

Figure 2:
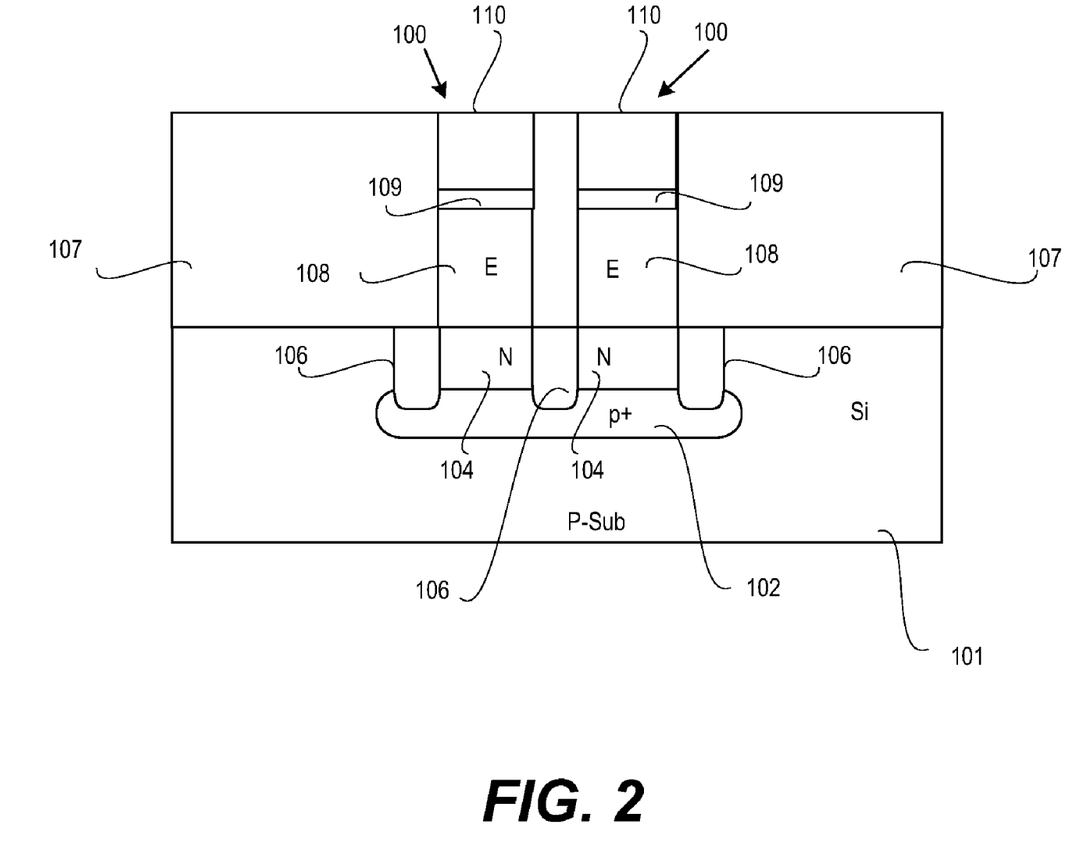

Referring to FIG. 2, an interlayer dielectric deposition (ILD) may then be performed with, for example, oxide, followed by an emitter lithographic formation. The area 100 may then be etched in order to open emitter areas (where the emitters 108 will subsequently be formed) and form ILD regions 107. High temperature silicon germanium (SiGe) is Epi (epitaxial) formed in the emitter areas in order to fill up the emitter areas with P+SiGe and thereby form the emitters. If needed, a CMP operation may be performed to smooth the surface. In accordance with various embodiments, this Epi step may be skipped if desired and emitters 108 may simply be silicon.

A base lithographic operation may then be performed for memory area opening and ion metal plasma (IMP) is provided to the base 104. It is desirable to insure that the IMP N+ covers the base pick-up. This may be followed by another emitter lithographic operation and IMP to the emitters 108. This is done to help ensure that the base 104 and emitters 108 maintain the proper level of doping after the SiGe Epi formation.

In accordance with various embodiments of the present invention, a silicidation may be performed in order to deposit silicide at regions 109. The silicidation may include depositing a layer of, for example, nickel or cobalt. The layer is then etched resulting in regions 109. This may be skipped if emitters 108 are silicon as opposed to Epi grown SiGe. A metallization may be performed to place a protective layer 110 of metal, for example tungsten, on the silicide regions 109 or directly on emitters 108 if the silicidation is skipped.

In accordance with various embodiments of the present invention, an interlayer dielectric layer 112 may then be deposited. This layer 112 is then etched over the emitters 108 until the silicide layer 109 is reached (if included) or until the emitter 108 is reached (if the silicide layer is not included). A metallization step may then be performed to fill the etched trenches with a protective layer 110 of tungsten. A CMP may then be performed to smooth and flatten the tungsten and ILD layers 110, 112. A layer 116 of nitride ($Si_3N_4$) may be deposited and a CMP may be performed if needed.

Figure 3:
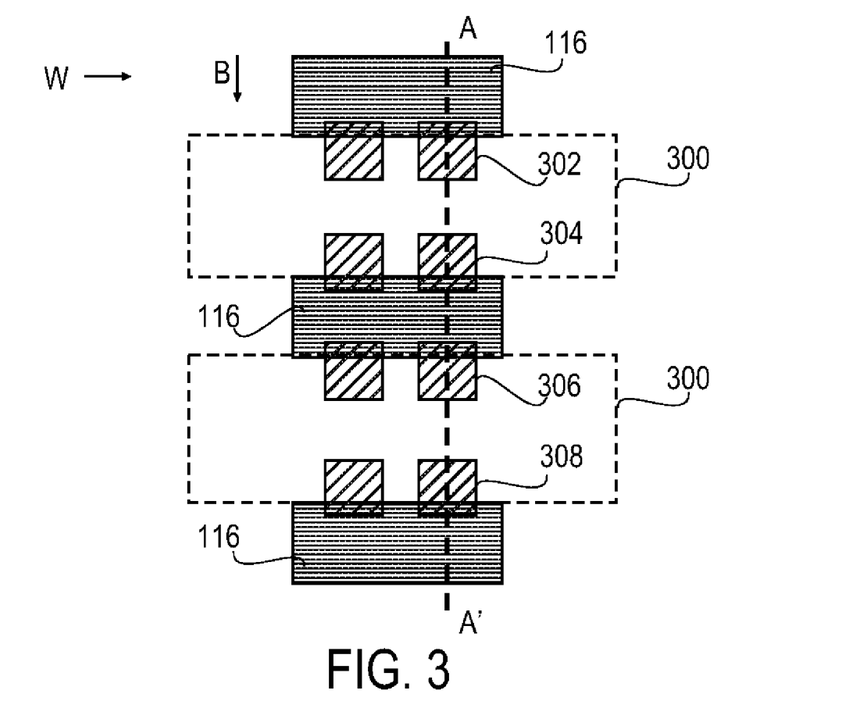
FIG. 3 is a top schematic view of the substrate illustrating a lithographic operation, in accordance with various embodiments of the present invention.
Figure 4:
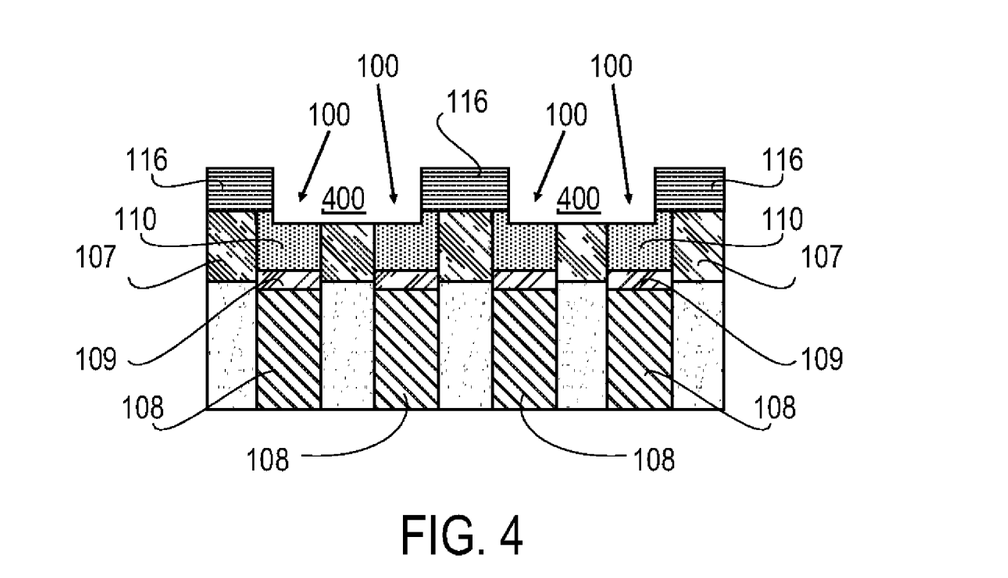
FIG. 4 is cross sectional schematic view of the substrate after the lithographic operation of FIG. 3, as seen along the line A-A' of FIG. 3, in accordance with various embodiments of the present invention.

Referring to FIGS. 3 and 4, a lithographic operation 300 is performed, in accordance with various embodiments of the present invention. FIG. 3 is a top view of a wafer that includes multiple cells 100 that have been previously described. FIG. 4 is a cross-sectional view through four cells 100 as seen along the line A-A' in FIG. 3.

The lithographic operation 300 includes etching a heater trench 400 through the nitride layer 116. As may be seen in FIGS. 3 and 4, the heater trench extends across at least a portion of two cells. The heater trench 400 is etched such that it has a depth that extends into the tungsten and ILD layers 110, 112.

As may be seen in FIG. 3, the lithographic operation 300 is illustrated as being performed in a word-line direction W across the wafer. Those skilled in the art will understand that the operation 301 may be performed in a bit-line direction B if desired.

A layer of heater alloy, for example, titanium nitride (TiN) or tantalum nitride (TaN), may then be conformally deposited within the heater trenches 400. A layer of nitride may then be deposited over the heater alloy layer.

Referring to FIGS. 5-8, an anisotropic etch of the heater trenches 400 is then performed. This removes portions of both the nitride and heater alloy layers that are planar, thus separating the heater alloy layer into two pieces 402a, 402b, as may be seen in FIG. 6. Thus, the heater alloy layer is now divided into two pre-heater element arrangements, where the pre-heater element arrangements also include nitride spacers 404a, 404b. In accordance with various embodiments, a layer 506 of oxide is deposited within the heater trenches 400. A CMP operation may then be performed to smooth the nitride and oxide layers 116, 506. The CMP process is performed until a vertical portion or leg 403 of the heater alloy pieces 402a, 402b are exposed.

In accordance with various embodiments of the present invention, a lithographic operation is performed in the bit-line direction in order to cut across the pre-heater element arrangements to thereby form the heater alloy layers into heater elements. As may be seen in FIGS. 6-8, the heater elements 402a, 402b are substantially L-shaped. If the lithographic operation 300 was performed in the bit-line direction, then this second lithographic operation would be performed in the word-line direction across the wafer. A layer 904 of nitride may then be deposited.

Figure 5:
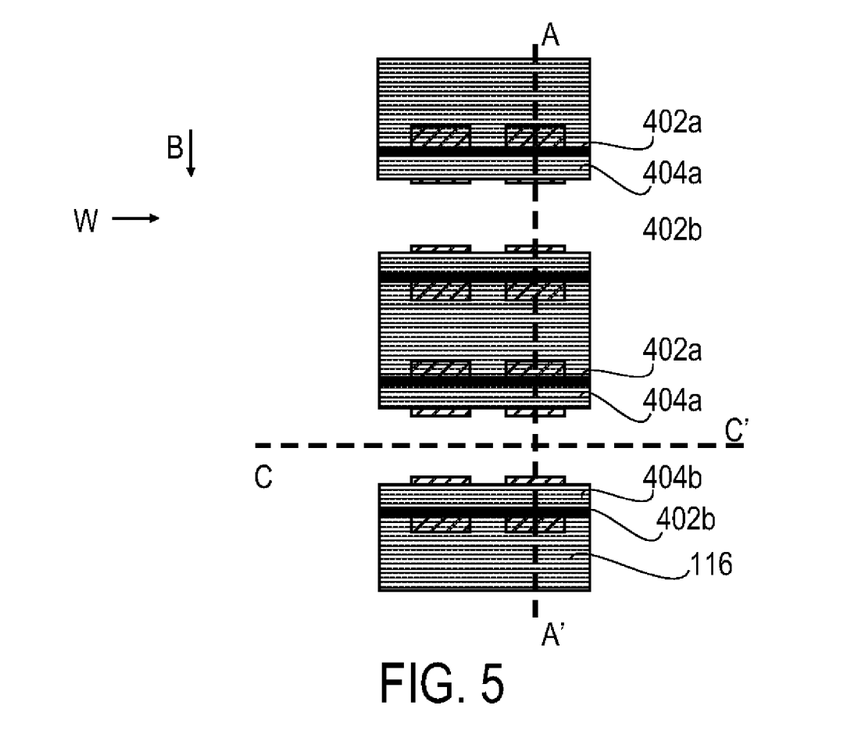
FIG. 5 is a top schematic view of the substrate illustrating lithographic operations, in accordance with various embodiments of the present invention.
Figure 6:
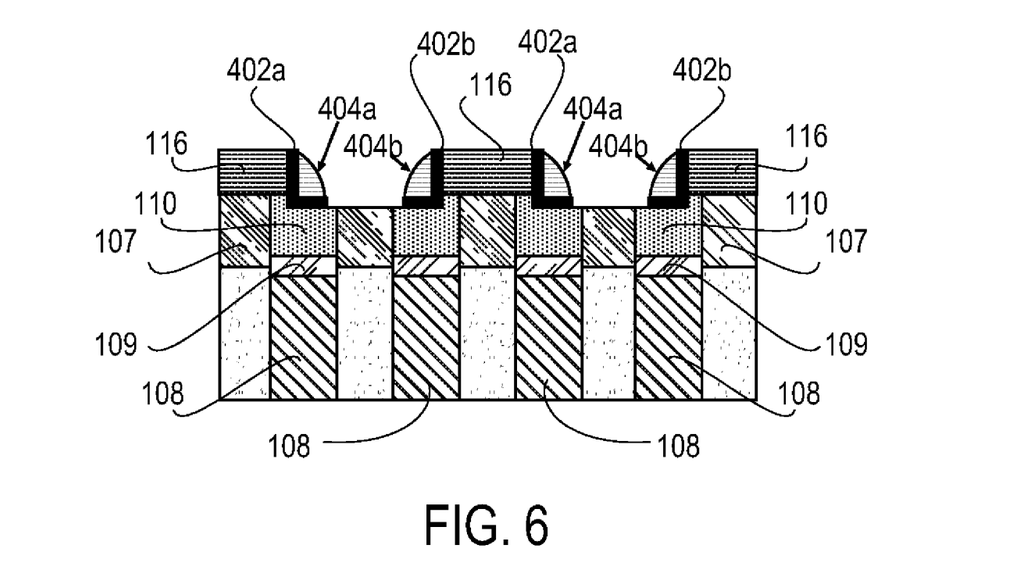
FIGS. 6-8 are cross sectional schematic views of the substrate after the lithographic operations of FIGS. 3 and 5, as seen along the line A-A' of FIG. 6, in accordance with various embodiments of the present invention.
Figure 7:
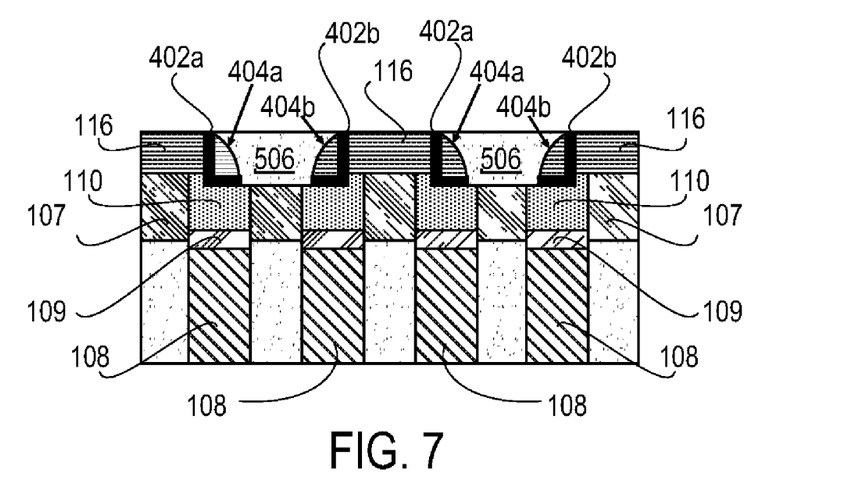
Figure 8:
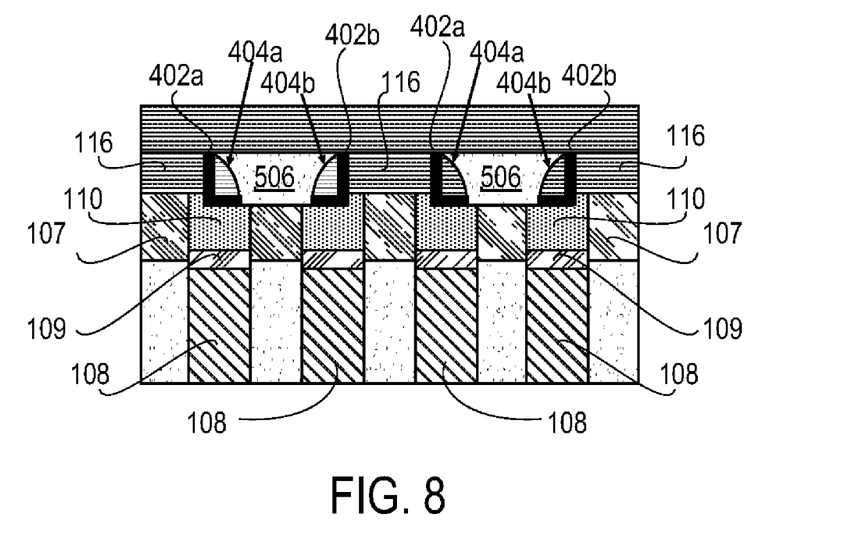
Figure 9:
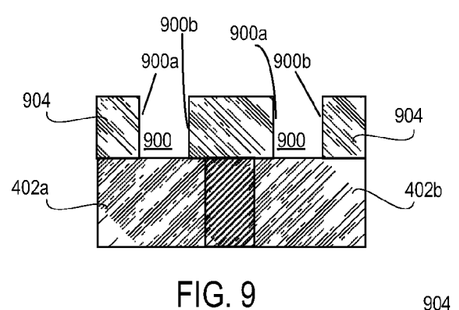
FIGS. 9-14 are cross sectional schematic views of a portion of the substrate, as seen along the line C-C' of FIG. 5, in accordance with various embodiments of the present invention.
Figure 10:
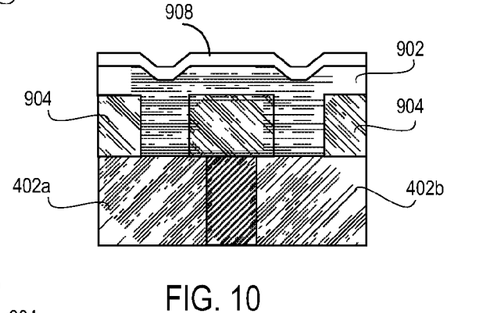
Figure 11:
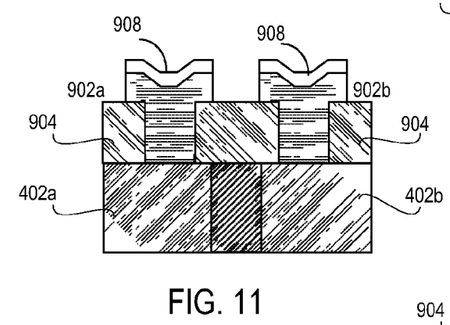

Referring to FIGS. 9-11, which are cross sectional views of a portion of the substrate as seen along the line C-C' of FIG. 5, in accordance with various embodiments of the present invention, a lithographic operation in the bit-line direction B may be performed on the layer 904 of nitride in order to create a PCM trench 900 and to expose the vertical portion or leg of the heater elements 402a, 402b for contact with a PCM portion, which will serve as a memory cell. The resulting exposure of heating elements 402a, 402b within trench 900 is relatively small. Thus, contact of heating elements 402a, 402b with GST material 902 will be small. In accordance with various embodiments, the trench side walls 900a, 900b may be sloped.

In accordance with various embodiments, the PCM material is germanium antimony tellurium (GST) material that is conformally deposited within the trench 900. In accordance with various embodiments, a top electrode layer 908 may be deposited on top of the GST material. Examples of material for the top electrode layer 908 include Ti, Ta, TiN and TaN. An anisotropic etch is then performed, leaving a thin layer 902a of GST material on the side wall 900a of the trench 900. Nitride 906 may then be deposited into the trench to fill it up. Alternatively, an ILD may be performed in order to fill up the trench. A CMP may then be performed to smooth the surface and to expose the GST material. If desired, the CMP process may be performed until a desired width W of the GST material at the top is exposed.

Figure 12:
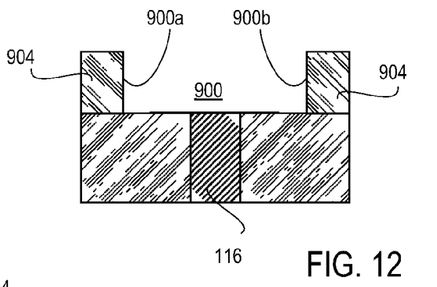
Figure 13:
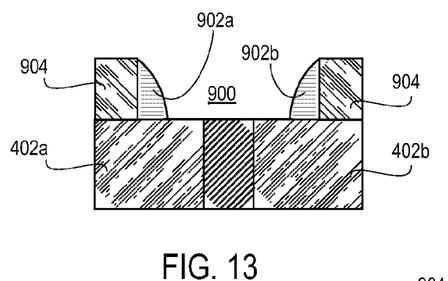
Figure 14:
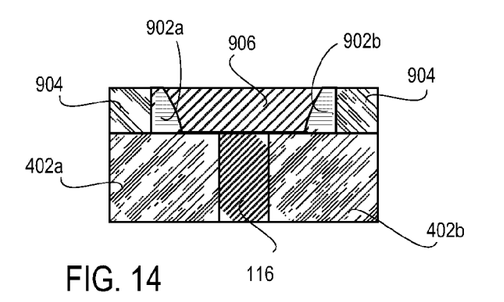

Referring to FIGS. 12-14, which are cross sectional views of a portion of the substrate as seen along the line C-C' of FIG. 5, the trench 900 may be etched such that it extends across a portion of two cells and thus, exposes two adjacent heater element vertical portions or legs. A layer of GST material may then be conformally deposited within the trench and an anisotropic etch is performed leaving a thin layer 902a, 902b of GST material on each side wall 900a, 900b of the trench 900. As may be seen, each side wall 900a, 900b is adjacent an exposed vertical portion or leg of the heater elements 402a, 402b. A nitride layer 906 may then be deposited to fill up the trench between the two thin layers of the GST material or alternatively, an ILD may be performed in order to fill up the trench 900. A CMP process may then be performed to smooth the layers and expose the GST material 902a, 902b. If desired, the CMP process may be performed until a desired width W of the GST material at the top is exposed.

Figure 15:
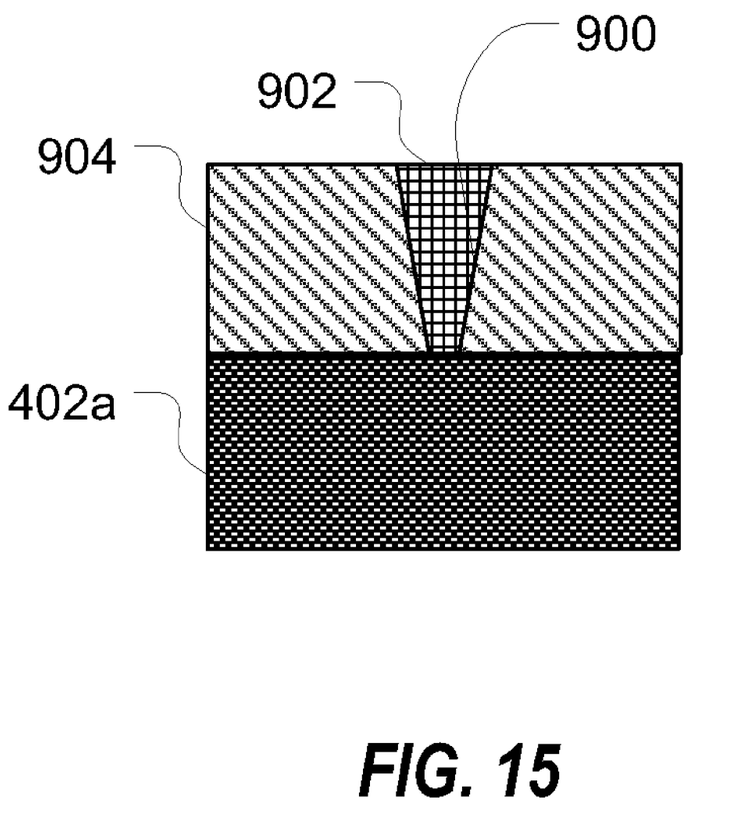
FIG. 15 is a cross sectional schematic view of a portion the substrate, as seen along the line C-C' of FIG. 5, in accordance with various embodiments of the present invention.

Referring to FIG. 15, PCM trench 900 may be formed via a microtrench operation resulting in the trench 900 having a tapered design as may be seen in FIG. 15. Once the trench has been formed, the GST material 902 may be deposited in order to fill the trench 900. Once the layer of GST material 902 has been deposited, the GST material 902 may be etched to thereby define the GST material 902 within the trench 900. The nitride layer 904 may then be deposited and a CMP may be performed.

Figure 16:
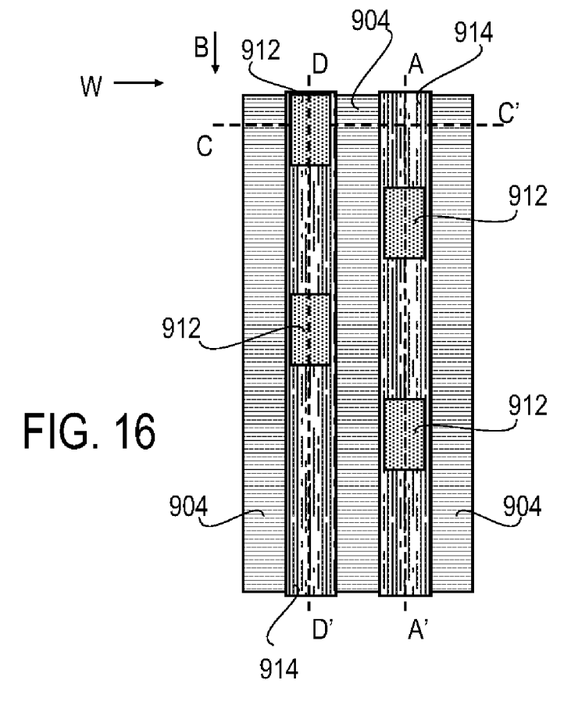
FIG. 16 is a top schematic view of the substrate illustrating after various lithographic operations, in accordance with various embodiments of the present invention.
Figure 17:
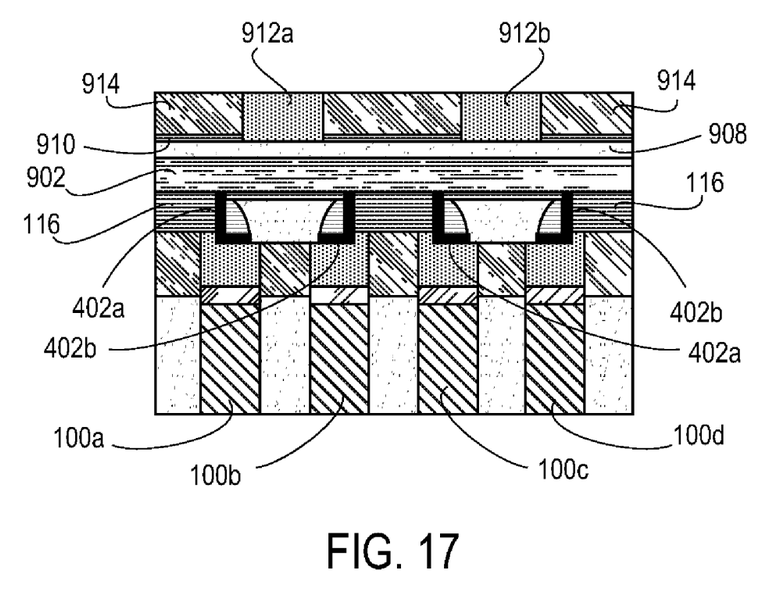
FIG. 17 is a cross sectional schematic view of the substrate after various lithographic operations, as seen along the line A-A' of FIG. 16, in accordance with various embodiments of the present invention.

Regardless of the method used to form the GST material 902 within the trenches 900, referring to FIGS. 16 and 17, an electrode layer 908 may then be deposited over the GST material 902 and the nitride layer 904. The electrode layer generally is a metal alloy. An etch stop layer 910 may then be deposited. As is known in the art, the etch stop layer 910 generally consists of a dielectric.

A lithographic operation in the form of a metallization may then be performed. The metallization includes depositing a layer of metal over the stop etch layer. In accordance with the various embodiments, the metal comprises tungsten. The metal layer may then be etched in the word and bit line directions in order to form top contacts 912. As may be seen in FIG. 16, the resulting top contacts are staggered relative to one another along adjacent lines A-A' and D-D'. As may be seen further in FIG. 17, which is a cross sectional view of a portion of the substrate as seen along the line C-C' of FIG. 16, each resulting top contact is located between two axes as defined by the emitter of each cell along a bit line. Thus, with reference to FIG. 16, a top contact 912a serves as the top contact for cells 100a and 100b, while a top contact 912b, serves as the top contact for cells 100c and 100d.

As may be further seen in FIGS. 16 and 17, each top contact 912 is etched and defined such that it has a substantially rectangular shape. The overall size and length of the top contacts are based upon the overall design constraints and the design rules associated with the device being constructed in order to keep the top contacts far enough apart to improve pitch and in order to maintain the GST memory cell functionality.

By staggering the top contacts with respect to each other along adjacent lines, the distance between top contacts, and thus the effective pitch, becomes the square root of: the squared distance between the top contacts in a horizontal direction plus the squared distance between the top contacts in a vertical direction ($\sqrt{x^2+y^2}$). By shaping the top contacts to be rectangular, lower resistance and a better reliability (for high current density) may be achieved. Additionally, with the rectangular shape of the top contacts, compensation for overlay and alignment errors may be realized.

Once the top contacts have been formed, an ILD deposition may be performed. The ILD layer 914 is etched to expose the top contacts 912. If desired, a CMP may be performed to smooth the surfaces of the top contacts 912 and the ILD layer 914.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:
   providing a substrate including an emitter layer, the emitter layer comprising a plurality of emitters, each emitter defining an axis;
   forming a heater layer above the emitter layer;
   forming a phase change memory (PCM) cell layer above the heater layer; and
   forming a top contact layer above the PCM cell layer, the top contact layer comprising a plurality of top contacts, each top contact being located between two different axes, each axis of the two different axes being defined by one emitter of the plurality of emitters.

2. The method of claim 1, wherein each top contact has a substantially rectangular shape.

3. The method of claim 1, wherein each top contact comprises tungsten.

4. The method of claim 1, wherein forming a heater layer comprises:
   forming heater trenches above the emitter layer, each heater trench having a width that extends across at least respective portions of two emitters;
   depositing a heater alloy layer within the heater trenches and depositing a first nitride layer over the heater alloy layer;
   performing an anisotropic etching of the first nitride layer and the heater alloy layer; and
   depositing an oxide layer over the first nitride layer.

5. The method of claim 4, further comprising:
   performing a lithographic operation on the substrate at the heater layer to form two heater elements within each heater trench.

6. The method of claim 5, wherein forming a PCM cell layer comprises:
   depositing a second nitride layer over the heater elements and etching PCM trenches within the second nitride layer;
   depositing germanium antimony tellurium (GST) material within the PCM trenches; and
   performing an anisotropic etching of the GST material.

7. The method of claim 6, wherein the PCM trenches have a width that extends over at least a portion of one emitter.

8. The method of claim 6, wherein the PCM trenches have a width that extends over at least respective portions of two emitters.

9. The method of claim 1, wherein forming a top contact layer comprises performing a metallization such that each top contact comprises a metal alloy.

10. The method of claim 9, wherein the metallization is performed with tungsten.

11. The method of claim 4, wherein the heater alloy layer comprises one of TiN or TaN.

12. The method of claim 11, wherein each top contact has a substantially rectangular shape.

13. The method of claim 1, wherein the plurality of emitters are arranged in rows and the top contacts are staggered with respect to top contacts in adjacent rows.

14. An apparatus comprising:
    a substrate including an emitter layer, the emitter layer comprising a plurality of emitters, each emitter defining an axis;
    a heater layer above the emitter layer;
    a PCM cell layer above the heater layer; and
    a top contact layer above the PCM cell layer, the top contact layer comprising a plurality of top contacts, each top contact being located between two different axes, each axis of the two different axes being defined by one emitter of the plurality of emitters.

15. The apparatus of claim 14, wherein each top contact has a substantially rectangular shape.

16. The apparatus of claim 15, wherein each top contact comprises tungsten.

17. The apparatus of claim 14, wherein the heater layer comprises heater elements within a heater trench, each heater element being adjacent an emitter, and each heater element having a substantially L-shape.

18. The apparatus of claim 17, wherein each heater element comprises one of TiN or TaN.

19. The apparatus of claim 18, wherein the PCM cell layer comprises PCM memory cells, each PCM memory cell being adjacent a vertical portion of a heater element.

20. The apparatus of claim 19, wherein the PCM memory cell comprises GST.

21. The apparatus of claim 20, wherein each top contact has a substantially rectangular shape.

22. The apparatus of claim 14, wherein the plurality of emitters are arranged in rows, and the top contacts are staggered with respect to top contacts in adjacent rows.

* * * * *